United States Patent
Chen et al.

(10) Patent No.: US 8,421,490 B2
(45) Date of Patent: Apr. 16, 2013

(54) LOADING CARD FOR MEASURING VOLTAGES

(75) Inventors: Chun-Po Chen, Taipei Hsien (TW); Chia-Ming Yeh, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 348 days.

(21) Appl. No.: 12/835,708

(22) Filed: Jul. 13, 2010

(65) Prior Publication Data

US 2011/0316573 A1 Dec. 29, 2011

(30) Foreign Application Priority Data

Jun. 23, 2010 (TW) ............................. 99120366 A

(51) Int. Cl.
*G01R 31/20* (2006.01)
*G01R 31/28* (2006.01)
(52) U.S. Cl.
USPC ............ 324/754.01; 324/754.07; 324/763.01

(58) Field of Classification Search ........................ None
See application file for complete search history.

(56) References Cited

U.S. PATENT DOCUMENTS

| | | | | |
|---|---|---|---|---|
| 4,978,912 | A * | 12/1990 | Vonder et al. | 324/754.08 |
| 5,283,605 | A * | 2/1994 | Lang-Dahlke | 324/763.01 |
| 5,436,570 | A * | 7/1995 | Tan | 324/754.07 |
| 6,357,022 | B1 * | 3/2002 | Nguyen et al. | 714/42 |
| 2003/0101391 | A1 * | 5/2003 | Man et al. | 714/718 |

* cited by examiner

*Primary Examiner* — Vinh Nguyen
(74) *Attorney, Agent, or Firm* — Altis Law Group, Inc.

(57) ABSTRACT

A loading card includes a printed circuit board, first and second connection portions. The first connection portion includes first and second voltage pins, and a first ground pin. The second connection portion includes third and fourth voltage pins, and a second ground pin. The loading card also includes a first voltage signal test point connected to the first and third voltage pins, a second voltage signal test point connected to the second and fourth voltage pins, a first ground signal test point connected to the first and second ground signal test points, and a second ground signal test point connected to the first and second ground signal test points.

3 Claims, 1 Drawing Sheet

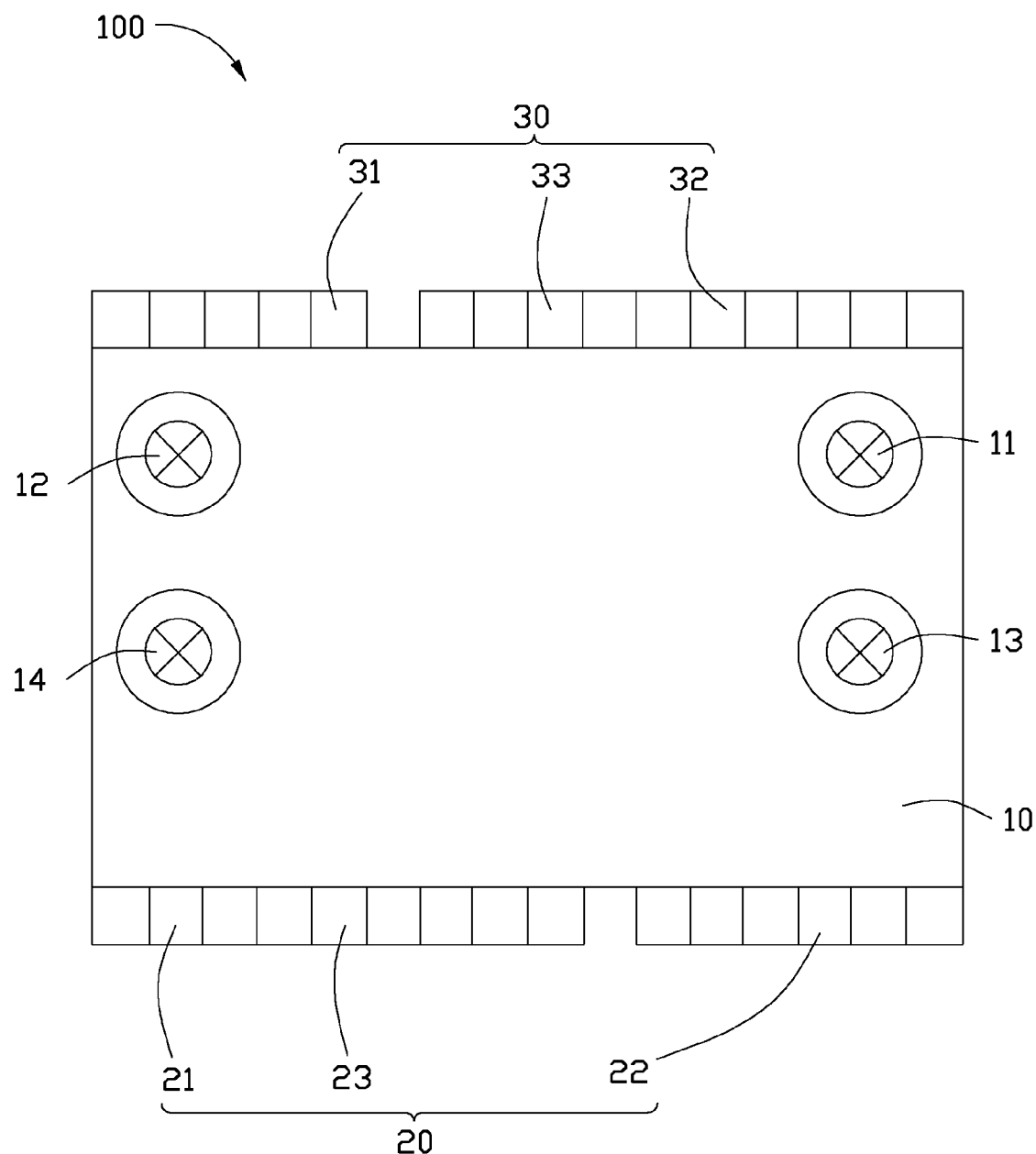

LOADING CARD FOR MEASURING VOLTAGES

BACKGROUND

1. Technical Field

The present disclosure relates to a loading card.

2. Description of Related Art

Presently, voltages of a memory of a motherboard are supplied by a voltage regulate module (VRM). A special tool is needed when measuring voltages obtained by the memory from the VRM. However, the special tool generally has a maximum current limitation or a maximum power limitation. In addition, when the special tool is used, a signal generator is needed to be used with it, which is inconvenient.

BRIEF DESCRIPTION OF THE DRAWING

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

The drawing is a schematic diagram of an exemplary embodiment of a loading card.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Referring to the drawing, an exemplary embodiment of a loading card 100 includes a printed circuit board (PCB) 10, a first connection portion 20 extending from a first end of the PCB 10, and a second connection portion 30 extending from a second end opposite to the first end of the PCB 10. The first connection portion 20 is used to engage in a first dual inline memory module (DIMM) slot of a motherboard. The first DIMM slot is used to receive a first memory. The first connection portion 20 has a plurality of first golden fingers. The second connection portion 30 is used to engage in a second DIMM slot of the motherboard. The second DIMM is used to receive a second memory. The second connection portion 30 has a plurality of second golden fingers. The plurality of first golden fingers include a first voltage pin 21, a second voltage pin 22, and a first ground pin 23. The plurality of second golden fingers includes a third voltage pin 31, a fourth voltage pin 32, and a second ground pin 33. The first DIMM slot includes a first voltage signal pin corresponding to the first voltage pin 21, a second voltage signal pin corresponding to the second voltage pin 22, and a first ground signal pin corresponding to the first ground pin 23. The second DIMM slot includes a third voltage signal pin corresponding to the third voltage pin 31, a fourth voltage signal pin corresponding to the fourth voltage pin 32, and a second ground signal pin corresponding to the second ground pin 33.

The PCB 10 includes a first voltage signal test point 11, a second voltage signal test point 12, a first ground signal test point 13 corresponding to the first voltage signal test point 11, and a second ground signal test point 14 corresponding to the second voltage signal test point 12. In the embodiment, the first voltage signal test point 11, the second voltage signal test point 12, the first ground signal test point 13, and the second ground signal test point 14 are soldering points. The first voltage signal test point 11 is electrically connected to the first voltage pin 21 of the first connection portion 20 and the third voltage pin 31 of the second connection portion 30. The second voltage signal test point 12 is electrically connected to the second voltage pin 22 of the first connection portion 20 and the fourth voltage pin 32 of the second connection portion 30. The first ground signal test point 13 is electrically connected to the first ground pin 23 of the first connection portion 20 and the second ground pin 33 of the second connection portion 30. The second ground signal test point 14 is electrically connected to the first ground pin 23 of the first connection portion 20 and the second ground pin 33 of the second connection portion 30.

To measure the first and second voltages obtained by the first memory from the first DIMM slot, the first connection portion 20 of the loading card 100 is inserted into the first DIMM slot. The first voltage signal test point 11 is connected to the first voltage signal pin of the first DIMM slot via the first voltage pin 21 of the first connection portion 20. The second voltage signal test point 12 is connected to the second voltage signal pin of the first DIMM slot via the second voltage pin 22 of the first connection portion 20. The first ground signal test point 13 is connected to the first ground signal pin of the first DIMM slot via the first ground pin 23 of the first connection portion 20. The second ground signal test point 14 is connected to the first ground signal pin of the first DIMM slot via the first ground pin 23 of the first connection portion 20. The first and second voltage signal test points 11 and 12, and the first and second ground signal test points 13 and 14 are connected to corresponding signal test terminals of a signal tester. The signal tester displays first and second voltages of the loading card 100. The first and second voltages of the first memory are substantially equal to the first and second voltages of the loading card 100.

To measure the third and fourth voltages obtained by the second memory from the second DIMM slot, the second connection portion 30 of the loading card 100 is inserted into the second DIMM slot. The first voltage signal test point 11 is connected to the third voltage signal pin of the second DIMM slot via the third voltage pin 31 of the second connection portion 30. The second voltage signal test point 12 is connected to the fourth voltage signal pin of the second DIMM slot via the fourth voltage pin 32 of the second connection portion 30. The first ground signal test point 13 is connected to the second ground signal pin of the second DIMM slot via the second ground pin 33 of the second connection portion 30. The second ground signal test point 14 is connected to the second ground signal pin of the second DIMM slot via the second ground pin 33 of the second connection portion 30. The first and second voltage signal test points 11 and 12, and the first and second ground signal test points 13 and 14 are connected to corresponding signal test terminals of a signal tester. The signal tester displays third and fourth voltages of the loading card 100. The third and fourth voltages of the second memory are substantially equal to the third and fourth voltages of the loading card 100.

In one embodiment, the first golden fingers of the first connection portion 20 correspond to the golden fingers of a double data rate 2(DDR2) memory, and the second golden fingers of the second connection portion 30 correspond to the golden fingers of a double data rate 3(DDR3) memory.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A loading card for measuring voltages from a first slot or a second slot, the loading card comprising:
    a printed circuit board (PCB);
    a first connection portion extending from a first end of the PCB, the first connection portion comprising:
        a first voltage pin corresponding to a first voltage signal pin of the first slot;
        a second voltage pin corresponding to a second voltage signal pin of the first slot; and
        a first ground pin corresponding to a first ground signal pin of the first slot;
    a second connection portion extending from a second end of the PCB, the second connection portion comprising:
        a third voltage pin corresponding to a third voltage signal pin of the second slot;
        a fourth voltage pin corresponding to a fourth voltage signal pin of the second slot; and
        second ground pin corresponding to a second ground signal pin of the second slot;
    a first voltage signal test point formed on the PCB and electrically connected to the first voltage pin of the first connection portion and the third voltage pin of the second connection portion;
    a second voltage signal test point formed on the PCB and electrically connected to the second voltage pin of the first connection portion and the fourth voltage pin of the second connection portion;
    a first ground signal test point formed on the PCB and electrically connected to the first ground pin of the first connection portion and the second ground pin of the second connection portion; and
    a second ground signal test point formed on the PCB and electrically connected to the first ground pin of the first connection portion and the second ground pin of the second connection portion.

2. The loading card of claim 1, wherein the first to fourth voltage pins are golden fingers, the first and second ground pins are golden fingers.

3. The loading card of claim 1, wherein the first connection portion supports a double data rate 2 memory slot, the second connection portion supports a double data rate 3 memory slot.

* * * * *